United States Patent [19]

Stansell et al.

[11] Patent Number: 5,764,714

[45] Date of Patent: Jun. 9, 1998

[54] LATCHING INPUTS AND ENABLING OUTPUTS ON BIDIRECTIONAL PINS WITH A PHASE LOCKED LOOP (PLL) LOCK DETECT CIRCUIT

[75] Inventors: Galen E. Stansell, Kirkland; J. Kenneth Fox, Bothell; Eric N. Mann, Issaquah; James P. Myers, Woodinville; Timothy V. Wright, Kirkland, all of Wash.

[73] Assignee: Cypress Semiconductor Corporation, San Jose, Calif.

[21] Appl. No.: 700,249

[22] Filed: Aug. 20, 1996

[51] Int. Cl.$^6$ ..................................... G06F 13/00
[52] U.S. Cl. .................. 375/377; 375/376; 395/832; 331/DIG. 2; 326/136
[58] Field of Search ..................... 375/376, 377; 395/821, 825, 826, 828, 832, 878; 326/136; 365/189.01, 189.03, 189.05, 230.08, 233; 331/DIG. 2; 327/156, 159

[56] References Cited

U.S. PATENT DOCUMENTS

| | | |
|---|---|---|
| 5,008,635 | 4/1991 | Hanke et al. |
| 5,539,338 | 7/1996 | Moreland ................................. 327/19 |
| 5,615,390 | 3/1997 | Kurahara ................................. 395/834 |

OTHER PUBLICATIONS

Shariatdoust et al. (AT&T Bell Laboratories), IEEE 1992 Custom Integrated Circuits Conference, pp. 24.2.1–24.2.5.
Alvarez et al., 1994 Symposium on VLSI Circuits Digest of Technical Papers, pp. 37–38.

Preliminary Data Sheet for Part CY2291, High Performance Data Handbook, Cypress Semiconductor, Pub. May 1995, pp. 10–13 to 10–17.

Primary Examiner—Stephen Chin
Assistant Examiner—Amanda T. Le
Attorney, Agent, or Firm—Dykema Gossett PLLC

[57] ABSTRACT

A circuit for latching inputs and enabling outputs on a bidirectional pin using a PLL lock detect circuit is disclosed. A PLL lock detect circuit generates an active lock control signal when an output reference signal is phase locked relative to an input reference signal applied to a phase locked loop (PLL) circuit. A latch and enable circuit is responsive to this lock control signal to latch the input signal (off of the pin), and, thereafter, enable output of an output signal onto the bidirectional pin. The latch and enable circuit includes a data latch to store the input signal when the lock control signal goes to an active state. The latch and enable circuit also includes a delay circuit to delay the lock control signal to produce a delayed lock control signal, and a tristateable output driver that is tristated when the delayed lock control signal is inactive, but, operates to pass (i.e., enable) the output signal to the bidirectional pin when the delayed lock control signal is active.

19 Claims, 3 Drawing Sheets

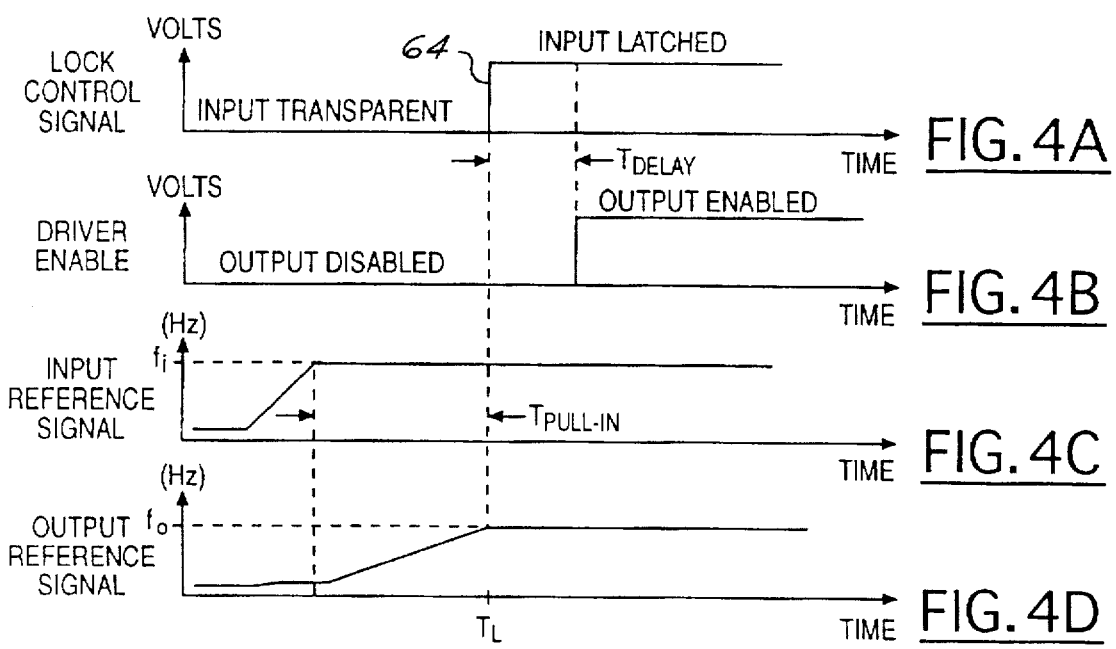
FIG. 4A
FIG. 4B
FIG. 4C
FIG. 4D
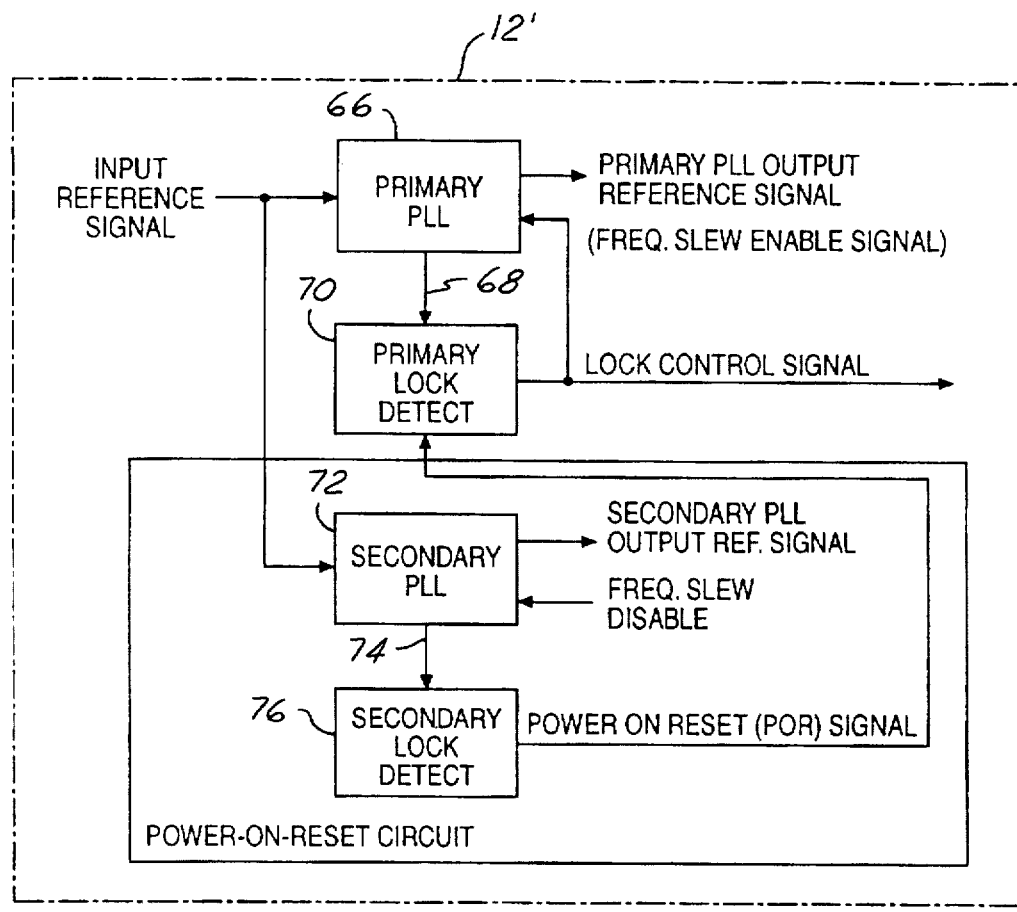
FIG. 5

LATCHING INPUTS AND ENABLING OUTPUTS ON BIDIRECTIONAL PINS WITH A PHASE LOCKED LOOP (PLL) LOCK DETECT CIRCUIT

INCORPORATION BY REFERENCE

This application is related to co-pending application entitled "AN APPARATUS FOR FAST PHASE-LOCKED LOOP FREQUENCY SLEWING DURING POWER ON", Ser. No. 08/622,531, filed Mar. 25, 1996, Attorney Docket No. 64,663-033 (CD96019), which is commonly owned by the assignee of the present invention, and hereby incorporated by reference. This application is also related to co-pending application entitled "AN ADJUSTABLE LOCK DETECTOR FOR A PHASE-LOCKED LOOP", Ser. No. 08/622,539, filed Mar. 25, 1996, Attorney Docket No. 64,663-032 (CD96018), which is commonly owned by the assignee of the present invention, and hereby incorporated by reference.

BACKGROUND OF THE INVENTION

1. Field of the Invention

The present invention relates generally to a system for latching input data, and enabling outputs on a bidirectional pin, and, more particularly, to a system that accomplishes such latching, and enabling according to a control signal corresponding to a lock state of a phase locked loop (PLL).

2. Description of the Related Art

A trend in packaging semiconductor devices has been to reduce the number of pins or terminals provided for any particular package. A reduced number of pins per package provides certain advantages well known to those of ordinary skill in the art, such as improved design flexibility, and product cost. Reducing pin count while retaining functionality sometimes means that two or more functions are, in some fashion, multiplexed on one pin. For example, a bidirectional pin may provide input functions under certain circumstances, and provide output functions under other circumstances. Thus, there has been much investigation in the area of semiconductor design in order to implement multiple functions on a single pin.

One situation of interest involves the above-mentioned bidirectional pin. In particular, in a semiconductor device including such a bidirectional pin, it may be desirable to latch input data on the pin, such as may be applied by an external device or circuit, and, subsequently, enable the same pin to generate output signals. For example, in certain conventional devices such as clock generator chips, select data bits are applied to bidirectional pins on power-up of the semiconductor device. The data bits are then latched and processed internally. These pins are thereafter reconfigured (i.e., "enabled"), to operate as output pins.

One approach taken in the art to implement this dual functionality on a bidirectional pin is to use a conventional power-on-reset ("POR") circuit, in combination with a delay line, and a data storage element. The conventional power-on-reset circuit may generally be formed using resistor chains, and produces a low-level output until the power supply has reached a predetermined operating level, and has stabilized. The POR circuit output then transitions to a high level. This high level signal, after a delay introduced by the delay line, latches the input data on the pins into the storage element. The storage element then outputs the stored signal for use by the core circuitry of the device. Then, after another predetermined delay, the bidirectional pin is enabled for producing an output signal.

One problem with the above-described conventional approach is that the delay introduced by the power-on-reset circuit is insufficient, generally, to permit the input data signals applied to the bidirectional pins to settle, thus necessitating the inclusion of a delay line. The delay line increases the total delay before the input data is latched. This additional circuitry adds complexity to the design. Moreover, the use of the conventional power-on-reset circuitry introduces reliability problems into the operation of the device. Specifically, they typically exhibit performance parameters (i.e., power supply trip levels) that are undesirably variable across fabrication process variations, as well as temperature (operating) variations. This variability means a conventional power-on-reset circuit could trip at a level that is either too high or too low. For example, for a 3.3 volt device, the POR circuit may be nominally designed to trip at 2 volts; however, due to the above-described undesirable variations in performance, the POR circuit may, in-fact, trip at 3.0 volts. In a common configuration where a 3.3 volt part operates within a range of between 3.0 volts and 3.6 volts, an undesirable situation may arise wherein the circuit trips even though the supply is within specification. Finally, the conventional approach only works during power-up of the device.

Thus, there is a need to provide an improved system for latching inputs, and enabling outputs on a bidirectional pin that minimizes or eliminates one or more of the problems as described above.

SUMMARY OF THE INVENTION

It is an object of the present invention to provide a system for controlling the input and output functions of a bidirectional pin that may be employed at any time during the operation of the device (as opposed to only during power-up of the device), and, which operates reliably under operating temperature variation, as well as over fabrication process variation. It is a further object of the present invention to provide such a system that is relatively straightforward to design and implement. An embodiment of the present invention, as applied to semiconductor devices, has one or more of the inventive bidirectional pins for efficiently and reliably providing both input latching, as well as output enabling functions, thereby permitting a reduced pin package.

These and other features and advantages are provided by a method, and a circuit in accordance with the present invention. The method involves the operation of a semiconductor device having an input/output node and includes three basic steps. The first step involves storing an input signal appearing on the node by using a control signal corresponding to a lock state of a phase locked loop (PLL) circuit. The second step involves delaying the control signal. Finally, the last step includes outputting an output signal on the input/output node using the delayed control signal. The "pull-in" process of the PLL circuit inherently provides a sufficiently long delay period for input data signals to settle on the input/output node (e.g., which may in turn be connected to a pin or terminal disposed in the device package). Thus, no separate delay circuit is required.

Moreover, the operation of the PLL circuit is more reliable than that of a conventional power-on-reset circuit, thereby eliminating the performance variations described in the Background. Finally, this invention eliminates the need for a conventional power-on-reset circuit, as well as the need for the delay circuit associated therewith.

In a preferred embodiment of this invention, a circuit corresponding to the above-referenced method is configured for latching an input signal, and enabling an output signal, on an input/output node of a semiconductor device. The circuit includes a PLL lock detector, a data latch, a delay circuit, and a tristateable output driver. The lock detector generates a lock signal corresponding to a lock state of the PLL. The data latch is connected to the input/output node and passes the input signal therethrough to its output when the lock signal is an inactive state. When the lock signal becomes active, the active level signal causes the data latch to store the input data signal therein, and to maintain it on its output for use internal to the device (e.g., core circuitry). The delay circuit delays the actived lock signal to produce a delayed lock signal in the active state. This active delayed lock signal enables the output driver (after a delay) to drive an output signal applied thereto onto the input/output node.

Other objects, features, and advantages of the present invention will become apparent to one skilled in the art from the following detailed description and accompanying drawings illustrating features of this invention by way of example, but not by way of limitation.

BRIEF DESCRIPTION OF THE DRAWINGS

FIGS. 4A–4D are timing chart diagrams showing the operation of the latch and enable circuit shown in FIG. 3.

FIG. 5 is a simplified schematic and block diagram view of a second, multi-PLL embodiment according to the present invention used to generate the lock control signal.

DETAILED DESCRIPTION OF THE PREFERRED EMBODIMENTS

Figure 1:
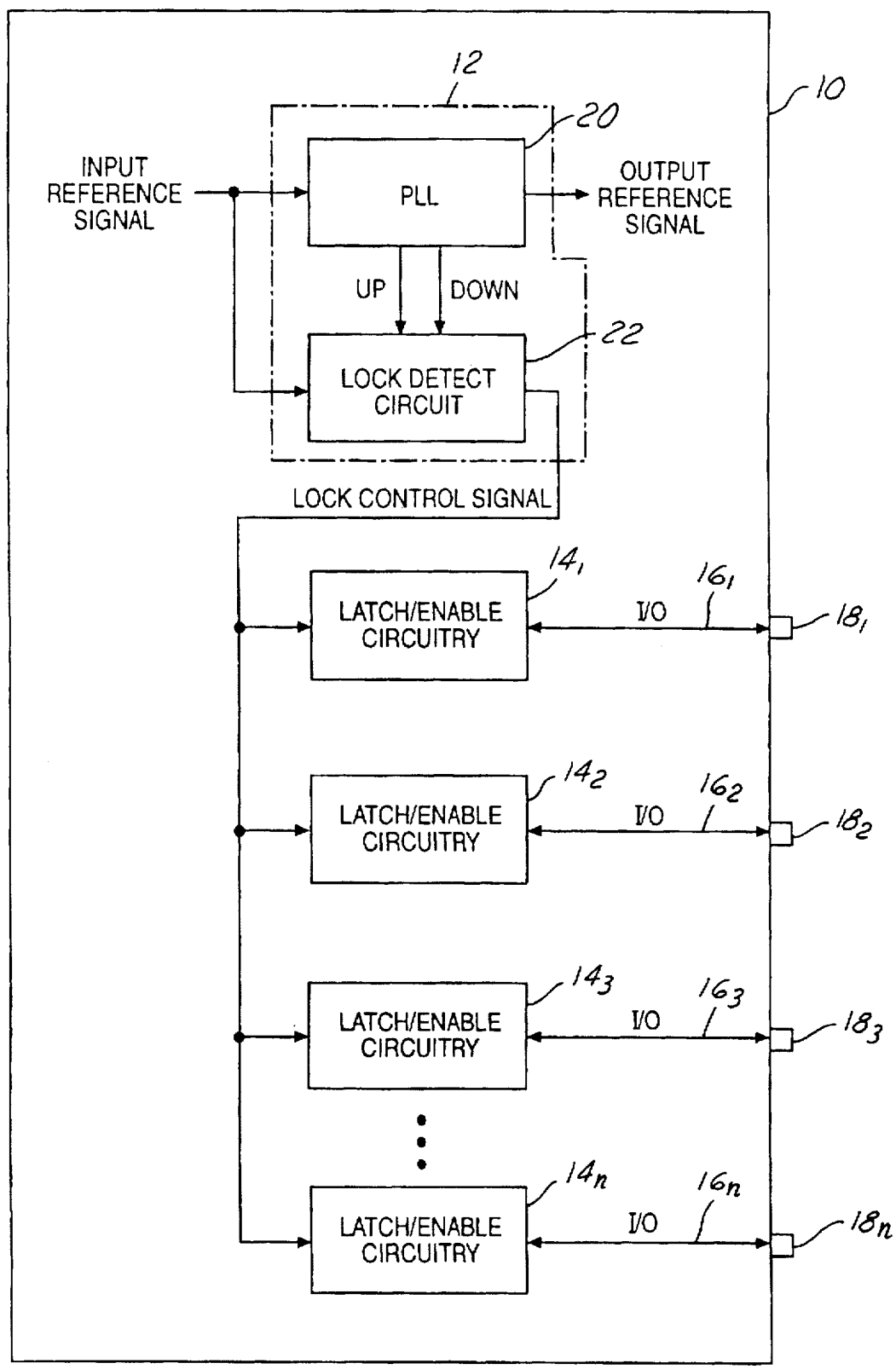
FIG. 1 is a simplified schematic and block diagram illustrating a semiconductor device according to the present invention.

Referring now to the drawings wherein like reference numerals are used to identify identical components in the various views, FIG. 1 shows an exemplary semiconductor device in which the present invention may be profitably employed, such as a clock generator integrated circuit 10. Clock generator 10 includes means or circuit 12 for generating a lock control signal, one or more latch and enable circuits $14_1, 14_2, 14_3, \ldots 14_N$, a corresponding one or more input/output nodes, $16_1, 16_2, 16_3, \ldots 16_N$, and another corresponding one or more terminals or pins $18_1, 18_2, 18_3, \ldots, 18_N$ connected to a respective node. In the preferred use of the present invention, pins $18_1, 18_2, 18_3,$ and $18_N$ are bidirectional pins that may be used to latch input data bits for control purposes, and, thereafter, be reconfigured as output clock signal sources. In particular, input data bits are applied by an external device to, for example, pins $18_1, 18_2$ and $18_3$, during power up. These three bits may form a ROM select code for selecting one of a plurality of clock frequencies to be generated on one or more outputs of clock generator 10. As further illustration, the code may operate to vary clock output frequencies between 33 and 75 MHZ. The data retrieved (e.g., from a non-volatile memory portion of generator 10) using this select code may be then used to configure various counters/dividers in clock generator 10 (and in particular, in a phase lock loop portion of chip 10) to thereby vary an output clock frequency, as is well known and conventional in the art. Another bidirectional pin, such as the pin designated $18_N$, may be used to input a mode select bit, which input may also occur during power up of chip 10. For example, the mode select bit may be used to configure certain outputs for a predetermined purpose (e.g., floppy clock, CPU clock, PCI clock, etc.). A detailed description of an exemplary clock generator which can be used in connection with the present invention may be found in a document entitled "Three-PLL Clock Generator— Preliminary CY2291", available from the assignee of the present invention.

Means 12 includes a phase lock loop (PLL) circuit 20, and a lock detect circuit 22. PLL circuit 20 is used to provide an output reference signal that is phase-locked relative to an input reference signal. That is, the output reference signal is substantially of the same frequency (i.e., as may be divided in a feedback path of the PLL by a feedback counter/ divider), and phase as the input reference signal. As should be appreciated by one of ordinary skill in the art, the basic PLL circuit 20 may include three parts: a phase/frequency detector (PFD), a loop filter, usually a low-pass filter, and a voltage/controlled oscillator (VCO) . It should be further appreciated that a phase detector is the part of the PFD that is essential to the PLL, the PFD being a specialized case of a phase detector. In a common configuration, a charge pump is also used. PLL 20, in a charge pump embodiment, generates a lock indicative signal, comprising an UP signal, and a DOWN signal, that is representative of whether, and the extent to which, the output reference signal is phase locked relative to the input reference signal. The basic setup of PLL 20, and its operation is conventional and well-understood in the art. For example, a conventional phase locked loop (PLL) circuit suitable for use in the present invention is disclosed in copending patent application entitled "AN APPARATUS FOR FAST PHASE-LOCKED LOOP FREQUENCY SLEWING DURING POWER ON", Ser. No. 08/622,531, filed Mar. 25, 1996.

Lock detect circuit 22 provides the means for generating a lock control signal corresponding to a lock state of PLL 20. In particular, lock detect circuit 22 receives as inputs the lock indicative signals (e.g., the UP, and DOWN signals), and the input reference signal. Lock detect circuit 22 produces the lock control signal in an active state when the output reference signal is phase locked to the input reference signal within a predetermined error margin. Lock detector 22 may comprise a conventional lock detect circuit found in the art (i.e., one without adjustable parameters). Preferably, however, lock detect circuit 22 comprises an adjustable lock detector that includes an adjustable phase error threshold level, as well as other adjustable features, as disclosed in copending patent application entitled "AN ADJUSTABLE LOCK DETECTOR FOR a PHASE-LOCKED LOOP CIRCUIT", filed Mar. 25, 1996, Ser. No. 08/622,539. It should be appreciated that other lock detect structures suitable for use in the present invention may be employed without departing from the spirit and scope of this invention.

Figure 2:
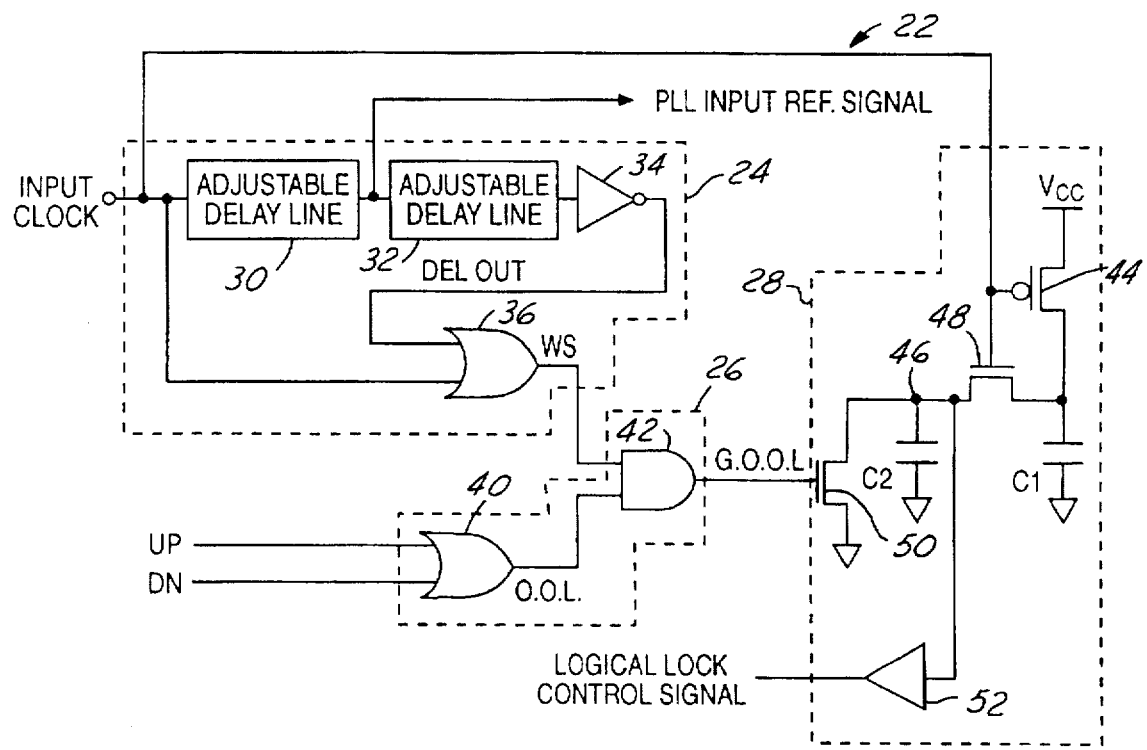
FIG. 2 is a simplified schematic and block diagram view showing a preferred lock detect circuit used in the embodiment illustrated in FIG. 1.

Referring now to FIG. 2, a simplified schematic and block diagram view of a preferred embodiment of lock detect circuit 22 is shown. Although a detailed description of the structure and operation of lock detect circuit 22 may be found in U.S. Ser. No. 08/622,539, a description sufficient for purposes of describing the present invention will be set forth immediately hereinafter. Lock detector 22 responds to the lock indicative signals (i.e., the UP and the DOWN signals) to generate a logical lock control signal which, when active, corresponds to a steady-state lock condition of PLL 20. Lock detector 22 may include means, such as window signal generator 24, for generating a window signal WS, means or circuit 26 for detecting when an actual out-of-lock (OOL) signal (e.g., the UP and DOWN signals) occurs outside of an acceptable phase error window, and means, such as an analog counter 28, for generating the logical lock control signal.

Windows signal generator 24 is responsive to an input clock for generating the window signal (WS). The window signal WS has a pulse width representative of, or, in other words, corresponding to, a predetermined acceptable phase error. The window signal WS is thus a pulse which defines an acceptable phase error window. The window signal generator 24 includes a first adjustable delay line 30, a second adjustable delay line 32, an inverter 34, and an OR gate 36. Delay lines 30 and 32 introduce first, and second amounts of delay, respectively, into the signal path of which they are a part. The first and second amounts of delay are adjustable. Structures for performing the delay function, adjustably, are conventional and well known.

Circuit 26 of lock detector 22 uses the UP, and DOWN signals generated by PLL 20 to generate a gated out-of-lock (GOOL) signal, when the actual out-of-lock (OOL) signals occur outside of an acceptable phase error window. Circuit 26 may take the form of an OR gate 40, and a disjunctive gating circuit, such as an AND gate 42.

Analog counter 28 includes a first capacitor C1, a first switch, such as a PMOS field effect transistor (FET) 44, a second capacitor C2, an output node 46, a second switch, such as an NMOS FET 48, a third switch, such as an NMOS FET 50, and a buffer 52.

It should be noted that the capacitance of C2 is relatively larger than the capacitance of C1. Thus, while the gated out of-lock signal is inactive, each input clock cycle serves to charge C2 to a progressively higher voltage potential. When the voltage potential observed at output node 46 reaches a trip point associated with buffer 52, the logical lock control signal will be asserted. It should be appreciated that the particular trip point level of counter 28 may be varied for any particular desired configuration. In one embodiment, however, buffer 52 generates the logical lock control signal, in the absence of any active GOOL signals, in approximately 160 clock cycles. To the extent that PLL 20 is out-of-lock, (as conveyed to lock detector 22 by way of the UP and DOWN signals), transistor 50 will be controlled to conduct. This conduction discharges capacitor C2, thus deferring, or inhibiting entirely, generation of an active logical lock control signal.

Figure 3:
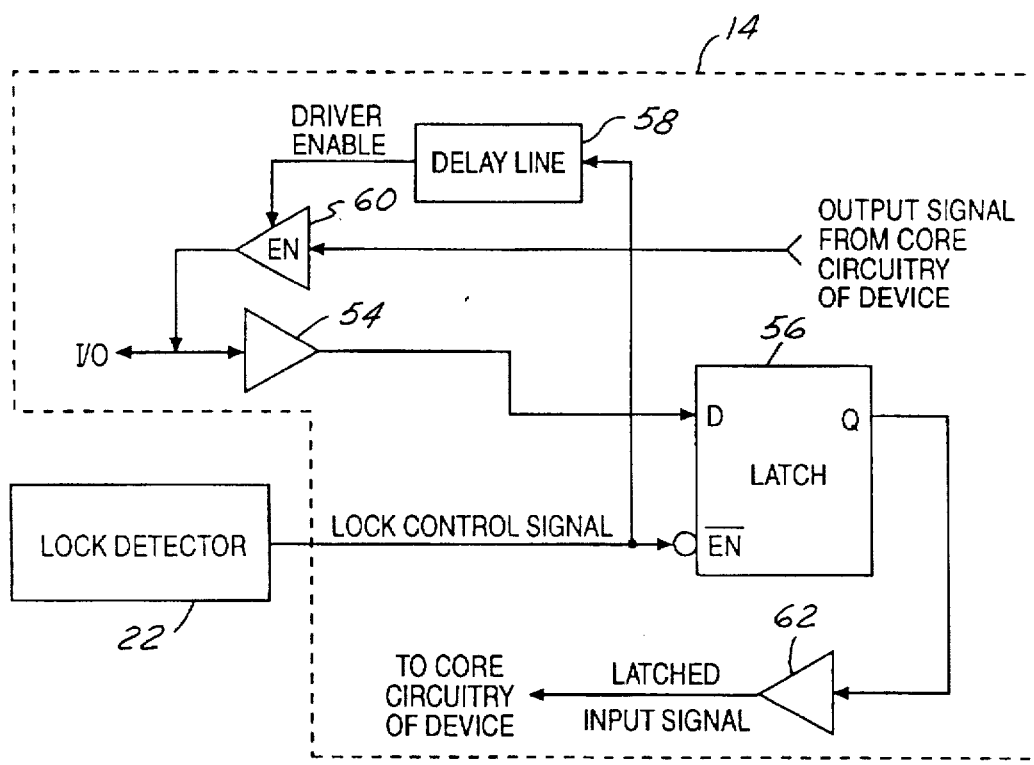
FIG. 3 is a simplified schematic and block diagram view showing, in greater detail, a preferred latch and enable circuit shown in block diagram form in FIG. 1.

FIG. 3 shows latch and enable circuit 14 in greater detail. Circuit 14 performs the function of storing an input signal appearing on the input/output node, and enabling thereafter an output signal to be driven onto the same input/output node. Circuit 14 includes buffer 54, means, such as a negative level transparent data latch 56, for storing the input signal appearing on the I/O node, means, such as a delay line 58, for delaying the lock control signal to produce a delayed lock control signal, means such as a tristateable output driver 60, for outputting the output signal from core circuitry to the node $16_i$, and an output buffer 62.

Buffer 54 provides its well-known buffering function from the I/O node to latch 56. Buffer 54 is conventional, and well-known in the art.

Latch 56 is also conventional and well-known in the art and provides a storage function. When the lock control signal, which is applied to an enable terminal of latch 56, is in an inactive state, latch 56 operates to pass the input signal from its D-input to its Q-output. However, when the lock control signal transitions to an active state, latch 56 stores the input signal therein and maintains the input data signal (so captured) on its Q-output thereafter.

Delay line 58 is conventional, and well-known in the art. Delay line 58 receives the lock control signal as an input to produce a delayed lock control signal output. This delayed lock control signal is used to enable driver 60 to output the output signal. This delay (by delay line 58) should be distinguished from the first of the two delays employed in the conventional approach (as described in the Background). The delay inserted by delay line 58 occurs after an asserted lock control signal is provided to latch 56, while the first delay in the conventional approach actually delays a power-on-reset signal from immediately reaching the storage latch after it becomes active. The delay provided by delay line 58 is relatively short relative to the first delay used to delay the power-on-reset signal in the conventional approach, and is thus much easier to design and implement.

Driver 60 is controlled by a driver enable signal, formed by the delayed lock signal, applied to its enable terminal, indicated at EN. In particular, when the driver enable signal is inactive, driver 60 assumes a high-impedance state, or, in other words, is tristated. This, in effect, blocks the output data signal from core circuitry of clock generator 10 from being coupled to the input/output node $16_i$. However, when the driver enable signal is activated, driver 60 passes the output signal to the input/output node $16_i$. Driver 60 is conventional, and well-known in the art.

Buffer 62 is provided to buffer the latch input signal for distribution to the core circuitry of clock generator 10. Buffer 62 is well-known and conventional.

Referring now to FIGS. 4A–4D, a description of the operation of the embodiment of FIG. 1 will now be set forth. Initially assume that an input signal appears on one or more of the bidirectional pins $18_1$, $18_2$, $18_3$, . . . . . $18_n$. Further assume that PLL 20 (best show in FIG. 1) is "unlocked". This "unlocked" condition may exist because clock generator 10 is either initially being powered up or, the "unlocked" condition may be due to a large frequency change in the input reference signal (i.e., input frequency slewing). It should be appreciated that such an input frequency slewing feature may be undesirable for embodiments that require only the power-on-reset functionality. As shown in FIG. 4A, during this initial interval, latch 56 transparently passes the input data signal appearing on the input/output node to its Q-output. As shown in FIG. 4B, also during this initial interval, the output function of the I/O node (and thus also the bidirectional pin) is disabled because driver 60 has been tristated. FIGS. 4C and 4D show, in exemplary fashion, the situation described above relating to the power up interval of clock generator 10. However, it should be understood that any input frequency changes sufficient to unlock PLL 20 will essentially cause lock detector 22 to generate an inactive lock control signal, and thus cause the latch and enable circuits $14_i$ to operate in the same manner as shown in the Figures.

PLL 20, over the next succeeding time period, (indicated as $T_{pull\_in}$), varies the frequency of its output reference signal (using the VCO) to phase lock the input reference signal therewith. This interval is shown most clearly in FIG. 4C.

When the PLL output reference signal becomes phase locked relative to the input reference signal, indicated at time $T_L$ (FIG. 4D), lock detector 22 responds by activating the lock control signal along edge 64 (best shown in FIG. 4A). Once this transition has occurred, latch 56 is controlled to store the input signal appearing on its D-input. This step of the method of the present invention thus involves storing the input signal appearing on the input/output node using the lock control signal in the active state. It should be appreciated that the lock control signal corresponds to a lock state of PLL 20 (here, the "locked" state). Conventional approaches employ a signal derived from a conventional power-on-reset circuit which, as described in the Background, is relatively unreliable over temperature and process variation, and, may require that it be used in combination with a delay line having a relatively large delay. The "pull in" interval ($T_{pull\_in}$ of FIG. 4C) needed by PLL 20 to phase lock its output reference signal to its input reference signal is long enough to allow voltage level variations of input signals appearing on respective input/output nodes to settle to their target states. It should be further appreciated that although latch 56 has stored the input data, and has provided that data to core circuitry of clock generator 10 by way of buffer 62, the output to bidirectional pin $18_i$ has not yet been enabled.

The next step of the method of the present invention involves delaying the activated lock control signal using delay line 58. This delay time, indicated as $T_{Delay}$, is best shown in FIGS. 4A, and 4B. After the delay interval $T_{Delay}$, delay line 58 then activates its output terminal to generate the driver enable signal (FIG. 4B).

Finally, the method of the present invention includes the step of outputting the output signal onto the input/output node using the driver enable signal (i.e., the delayed lock control signal). In the preferred clock generator embodiment, the core circuitry thereof may then use the pin $18_i$ coupled to the respective input/output node to provide a reference clock signal output for use by external devices or, for any other purpose necessary, or desirable.

It should be understood that circuit 14 may be conveniently implemented using a computing element programmed according to the teachings of the present specification, as will be apparent to those skilled in the art. In particular, the lock control signal may be provided to a programmed control module which, in turn, will store the input signal, and, subsequently, enable an output signal to be driven onto the input/output node connected to one of the bidirectional pins $18_i$. Appropriate software coding can readily be prepared by skilled programmers based on the teachings of the present disclosure, as will be apparent to those of ordinary skill in the art. The present invention thus also includes a computer program product which may comprise a storage medium including instructions which can be used to program a computer to perform a process of the invention. The storage medium can include, but is not limited to, any type of disk including floppy disks, optical disks, CD-ROMs and magneto-optical disks, ROMS, RAMS, EPROMS, EEPROMS, magnetic or optical cards, or any type of medium suitable for storing electronic instructions.

FIG. 5 shows a second, multi-PLL embodiment of the means for generating the lock control signal. Specifically, lock control signal generating means 12' is used to guarantee a power-on-reset function upon power up of clock generator 10. Circuit 12' includes a primary PLL circuit 66 generating a primary lock indicative signal 68, a primary lock detector 70, a secondary PLL circuit 72 generating a secondary lock indicative signal 74, and a secondary lock detect circuit 76. Circuit 12' corresponds substantially to a dual-mode-of-operation frequency-generating apparatus disclosed in copending patent application entitled "AN APPARATUS FOR FAST PHASE-LOCKED LOOP FREQUENCY SLEWING DURING POWER ON", Ser. No.: 08/622,531, filed Mar. 25, 1996, and assigned to the common assignee of the present invention. Although a detailed description may be found in Ser. No. 08/622,531, a description of circuit 12' sufficient for purposes of the present invention will be set forth immediately hereinafter.

Primary PLL 66 includes two distinct modes of operation; namely, a non-frequency slewing mode of operation for use, for example, during power-up for providing a fast PLL lock, and, a second, frequency-slewing mode for use during normal operation to provide relatively slow, controlled frequency rate changes. The mode is selected using a frequency slewing enable signal, as shown in FIG. 5. This enable signal is defined by the lock control signal generated by primary lock detector 70. When the frequency slewing enable signal is active, the controlled slew rate mode is enabled. However, when the frequency slewing enable signal is inactive, the PLL slews very quickly between frequencies.

Primary lock indicative signal 68 may comprise, for example, in a charge pump embodiment of PLL 66, the well-known UP and DOWN signals.

Primary lock detect circuit 70 is used to generate the lock control signal when the primary PLL output reference signal is phase locked to the input reference signal, and, a power-on-reset signal (essentially used as an enable signal) from secondary lock detect circuit 76 is in an active state.

Secondary PLL 72, and secondary lock detect circuit 76 form, in function, a novel power-on-reset circuit. Secondary PLL may be a conventional PLL (i.e., one does not include a second, frequency slewing mode), since, such a mode would be disabled in any event.

Secondary lock indicative signal 74 may comprise an UP signal and a DOWN signal for a charge pump based PLL 72.

Secondary lock detector 76 operates to generate the power-on-reset signal when the secondary PLL output reference signal is phase locked to the input reference signal. As noted in Ser. No. 08/622,531, secondary PLL output reference signal has an output frequency that is lower than the output frequency of the primary PLL output reference signal, and, further, the acceptable phase error permitted by secondary lock detect 76 is greater than that permitted by primary lock detect circuit 70. Therefore, secondary lock detect 76 will likely indicate lock (by asserting the power-on-reset signal) before primary lock detector 70.

This power-on-reset signal is then used to enable primary lock detect circuit 70 for outputting the lock control signal for use in the present invention (i.e., it is coupled to the latch and enable circuit 14). One operational characteristic of primary PLL 66 is that once the lock control signal is activated by detector 70, thus enabling the frequency slewing mode of operation, primary PLL 66 operates to modify the lock indicative signal 68 (e.g., UP and DOWN signals) so that primary lock detect circuit 70 will thereafter, until powered down, report a locked condition. Since circuit 70 will maintain the lock control signal in the active state, the modification (e.g., truncation according to a phase error window signal, as described in Ser. No. 08/622,531) to the UP and DOWN signal will thereafter always occur until the device is powered down. The PLL 66 thus includes means for modifying the lock indicative signal to maintain the lock signal produced by detector 70 in an active state until powered off. This may be desirable, for example, when frequency slewing is necessary or desirable, since the bidirectional pin $18_i$ will be maintained as an output, thus providing frequency slewing on such output.

One purpose of the second embodiment of the invention which uses lock control signal generating means 12', is to guarantee the power-on-reset function. Another is to permit frequency slewing. In this second embodiment of the present invention, the input signals appearing on the input/output nodes are latched by data latch 56. After a delay introduced by delay 58, the output drivers will be enabled for outputting the output signal (from core circuitry), on corresponding bidirectional pins 18, for the remaining time in which device 10 is powered up. Controlled PLL frequency slewing is allowed without losing the output function on such pins.

The embodiment according to the present invention stores input signals, and/or enables an output signal to be driven onto a bidirectional pin according to a control signal corresponding to a lock state of a phase lock loop (PLL). Such an embodiment obviates the need for a conventional power-on-reset circuit, which has the disadvantage of working only on power up of the device and, operates unreliably in some cases.

While the invention has been particularly shown and described with reference to the preferred embodiments, it is well understood by those skilled in the art that various changes and modifications can be made in the invention without departing from the spirit and scope of the present invention, which is limited only by the appended claims. For example, although many of the control signals were described as being either active-low or active high, it should be appreciated that complementary logic is fully within the spirit and scope of this invention.

We claim:

1. A method of operating a semiconductor device having an input/output node comprising the steps of:
   storing an input signal appearing on the node using a control signal corresponding to a lock state of a phase locked loop (PLL);
   delaying the control signal; and,
   outputting an output signal on the node using the delayed control signal.

2. The method of claim 1 further including the steps of:
   applying an input reference signal to the PLL of the semiconductor device;
   generating the control signal when an output reference signal is phase locked relative to the input reference signal.

3. The method of claim 2 wherein a time between said applying step and said generating step defines a delay interval, the delay interval being long enough to allow voltage level variations of the input signal to settle.

4. The method of claim 1 wherein the PLL is a primary PLL, the semiconductor device further including a secondary PLL, said method further including the steps of:
   applying an input reference signal to the primary PLL and the secondary PLL;
   generating a power-on-reset signal when a secondary PLL output reference signal is phase locked to the input reference signal; and,
   generating the control signal in an active state when the primary PLL output reference signal is phase locked to the input reference signal and the power-on-reset signal is in an active state.

5. The method of claim 4 wherein said power-on-reset generating step is performed during a power up interval of the semiconductor device, and said control signal generating step includes the substep of:
   maintaining the control signal in the active state by modifying a lock indicative signal generated by the primary PLL using the control signal in the active state.

6. The method of claim 1 wherein said storing step includes the substeps of:
   passing the input signal to an input terminal of a memory storage device controlled for storage by the control signal; and,
   controlling the memory storage device to store the input signal therein when the control signal is in an active state.

7. The method of claim 1 wherein said outputting step is performed by the substep of:
   activating an output driver using the control signal in an active state.

8. A circuit for latching an input signal and enabling an output signal on an input/output node of a semiconductor device comprising:
   means for storing said input signal appearing on said node using a control signal corresponding to a lock state of a phase locked loop (PLL);
   means for delaying said control signal to produce a delayed control signal; and,
   means for enabling an output signal to be output on said node using said delayed control signal.

9. The circuit of claim 8 further including:
   means for generating said control signal when an output reference signal is phase locked relative to an input reference signal.

10. The circuit of claim 9 wherein said generating means comprises a lock detector responsive to a lock indicative signal for generating said control signal when said output reference signal is phase locked relative to said input reference signal.

11. The circuit of claim 8 wherein said storing means comprises a data latch having an input terminal for receiving said input signal from said node, said data latch being triggered by said control signal to store said input signal therein, said data latch having an output terminal for outputting said stored input signal.

12. The circuit of claim 8 wherein said delaying means comprises a delay line having an input for receiving said control signal, and an output terminal for producing said delayed control signal.

13. The circuit of claim 8 wherein said enabling means comprises a tristateable output driver having an input terminal for receiving said output signal, and an output terminal coupled to said node, said driver further including an enable terminal responsive to said delayed control signal to thereby enable blocking of said output signal to said node when said delayed control signal is in an inactive state, and to enable passing of said output signal to said node when said delayed control signal is in an active state.

14. The circuit of claim 8 wherein said PLL is a primary PLL having an input terminal responsive to said input reference signal, a first output terminal for generating a primary PLL output reference signal, and a second output terminal for generating a primary lock indicative signal, said circuit further including:
   a secondary PLL having an input terminal for receiving said input reference signal and a first output terminal for generating a secondary PLL output reference signal, said secondary PLL further including a second output terminal for generating a secondary lock indicative signal;
   a secondary lock detector responsive to said secondary lock indicative signal for generating a power-on-reset signal when said secondary PLL output reference signal is phase locked to said input reference frequency; and, a primary lock detector responsive to said primary lock indicative signal and said power-on-reset signal for generating said control signal in an active state when the primary PLL output reference signal is phase locked to said input reference signal and said power-on-reset signal is in an active state.

15. The circuit of claim 14 wherein said primary PLL includes means for modifying said primary lock indicative signal using said control signal in said active state to enable said primary lock detector to maintain said control signal in said active state wherein said node is enabled for outputting said output signal until power is removed from said semiconductor device.

16. The circuit of claim 8 wherein said control signal is derived exclusively from said PLL.

17. A circuit for latching an input signal and enabling an output signal on an input/output node of a semiconductor device comprising:

- a primary phase locked loop (PLL) lock detector for generating a primary lock signal corresponding to a lock state of a primary PLL;
- a data latch having a data input terminal for receiving said input signal from said node, an output terminal, and an enable input terminal responsive to said lock signal for controlling storage therein;
- a delay circuit having an input terminal responsive to said lock signal, and having an output terminal for producing a delayed lock signal; and,
- a tristateable output driver having an input terminal for receiving said output signal and an output terminal for driving said output signal onto said input/output node, said driver further including an enable input terminal responsive to said delayed lock signal;

wherein when said lock signal is generated in an active state, said latch stores said input signal therein for output on said data latch output terminal, said delayed lock signal being thereafter generated in an active state by said delay circuit to enable said driver to output said output signal to said input/output node.

18. The circuit of claim 17 wherein said primary PLL includes an output terminal for generating a primary lock indicative signal, said primary PLL lock detector is responsive to said primary lock indicative signal for generating said primary lock signal.

19. The circuit of claim 18 further including:

- a secondary PLL responsive to an input reference signal for generating a secondary PLL output reference signal locked thereto, said secondary PLL including an output terminal for generating a secondary lock indicative signal representative of the extent to which said secondary PLL output reference signal is locked to said input reference signal; and,
- a secondary PLL lock detector responsive to said secondary lock indicative signal for generating a secondary lock signal when said secondary PLL output reference signal is locked to said input reference signal, said secondary lock signal defining a power-on-reset signal for use when said semiconductor device is powered up;

said primary PLL lock detector being enabled for outputting said primary lock signal when said power-on-reset signal is in an active state.

* * * * *